United States Patent
Lee et al.

(10) Patent No.: US 12,255,075 B2
(45) Date of Patent: Mar. 18, 2025

(54) ATOMIC LAYER ETCHING METHOD USING LIGAND EXCHANGE REACTION

(71) Applicants: SK hynix Inc., Icheon-si (KR); Merck Patent GmbH, Darmstadt (DE)

(72) Inventors: Jae Chul Lee, Icheon-si (KR); Hyun Sik Noh, Icheon-si (KR); Dong Kyun Lee, Icheon-si (KR); Eun Ae Jung, Icheon-si (KR); Kyoung-Mun Kim, Daejeon (KR); Jooyong Kim, Siheung-si (KR); Younghun Byun, Jeungpyeong-gun (KR); Byeong Il Yang, Daejeon (KR); Changhyun Jin, Incheon (KR)

(73) Assignees: SK hynix Inc., Icheon (KR); Merck Patent GmbH, Darmstadt (DE)

( * ) Notice: Subject to any disclaimer, the term of this patent is extended or adjusted under 35 U.S.C. 154(b) by 158 days.

(21) Appl. No.: 18/155,691

(22) Filed: Jan. 17, 2023

(65) Prior Publication Data
US 2024/0079249 A1    Mar. 7, 2024

(30) Foreign Application Priority Data
Sep. 5, 2022    (KR) .................. 10-2022-0111826

(51) Int. Cl.
*H01L 21/311*    (2006.01)

(52) U.S. Cl.
CPC ................. *H01L 21/31122* (2013.01)

(58) Field of Classification Search
None
See application file for complete search history.

(56) References Cited

U.S. PATENT DOCUMENTS

| 2015/0270140 A1* | 9/2015 | Gupta ............... H01L 21/32136 |
| | | 216/67 |
| 2019/0112716 A1 | 4/2019 | Winter |
| 2020/0316645 A1 | 10/2020 | George et al. |
| 2021/0104414 A1 | 4/2021 | Panagopoulos et al. |
| 2024/0128092 A1* | 4/2024 | Nakane .................... C23F 1/02 |

FOREIGN PATENT DOCUMENTS

| KR | 10-2307542 B1 | 7/2018 |
| KR | 2018-0073459 A | 7/2018 |
| KR | 2019-0089222 A1 | 7/2019 |
| KR | 10-2360672 B1 | 7/2020 |

* cited by examiner

*Primary Examiner* — Allan W. Olsen

(57) ABSTRACT

An atomic layer etching method using a ligand exchange reaction may include a substrate providing step of putting a substrate with a thin film formed thereon into a reaction chamber, a halogenated thin film forming step of forming a halogenated thin film on a surface of the thin film by infusing a halogenated gas into the reaction chamber, and an etching step of etching the halogenated thin film by infusing a ligand without a metal or metal precursor into the reaction chamber with the substrate with the halogenated thin film.

7 Claims, 3 Drawing Sheets

ATOMIC LAYER ETCHING METHOD USING LIGAND EXCHANGE REACTION

CROSS-REFERENCE TO RELATED APPLICATION

This application claims priority under 35 U.S.C. § 119 to Korean Patent Application No. 10-2022-0111826 filed in the Korean Intellectual Property Office on Sep. 5, 2022, which is incorporated herein by reference in its entirety.

BACKGROUND

1. Technical Field

Embodiments of the present disclosure relate to an atomic layer etching method using a ligand exchange reaction, and more particularly, to an atomic layer etching method using a ligand exchange reaction in which the reaction is performed using a ligand without a metal precursor. As a result, the manufacturing cost of a precursor material can be reduced or avoided, metal atoms can be suppressed or prevented from remaining on a substrate after etching, and a fluoride thin film can be etched in atomic units without damaging the substrate.

2. Related Art

In a semiconductor device etching technical field, atomic layer etching (ALE) may perform critical etching with a very high degree of accuracy for semiconductor device manufacturing.

In atomic layer etching, in order to etch an atomic layer of a substrate such as a semiconductor wafer, a monolayer of the substrate is removed for each processing cycle, and a reaction material gas is introduced into a processing chamber in order to modify the surface of the substrate. For example, in order to provide a halide-infused top layer, a gas containing halide species is used.

For example, a gas containing molecular chlorine species may be introduced in order to modify a surface layer of a silicon substrate from silicon to silicon chloride. After the surface layer is modified, the processing chamber is purged of the remaining gas. After the surface layer modified into plasma is removed, by-products are discharged.

It is also possible to introduce a metal ligand including a metal precursor in order to modify a metal oxide surface of the substrate during the metal atomic layer etching of the substrate.

However, such metal atomic layer etching is problematic because rate and selectivity are limited and because plasma modification may cause structural damage to a semiconductor device.

Accordingly, the present disclosure intends to provide a method capable of etching a thin film in thicknesses measured in atomic units by using a ligand exchange reaction causing no damage to a substrate.

Reference is made to Korean Patent Application Publication No. 10-2019-0089222 (published on Jul. 30, 2019), which is incorporated herein by reference.

SUMMARY

An atomic layer etching method using a ligand exchange reaction in accordance with an embodiment of the present disclosure includes: a substrate providing step of putting a substrate with a thin film formed thereon into a reaction chamber; a halogenated thin film forming step of forming a halogenated thin film on a surface of the thin film by infusing a halogenated gas into the reaction chamber; and an etching step of etching the halogenated thin film by infusing a ligand without a metal or metal precursor into the reaction chamber with the substrate with the halogenated thin film.

The halogenated gas may include at least one selected from the group consisting of hydrogen fluoride, xenon fluoride, sulfur tetrafluoride, sulfur hexafluoride, hydrogen bromide, diatomic bromine, hydrogen chloride, and dichlorine.

The film may include a Group 4 metal oxide alone, or includes two or more Group 4 metal oxides.

The Group 4 metal oxide may include hafnium oxide ($HfO_2$), zirconium oxide ($ZrO_2$), zirconium silicon oxide ($ZrSiO_4$), or hafnium zirconium oxide ($HfZrO_4$).

The halogenated thin film may include a group 4 metal halide alone, or includes two or more group 4 metal halides.

The ligand including no metal or metal precursor may include an imine compound having two ketimine groups.

The imine compound having the two ketimine groups may include 1,3-diketimines.

The etching step may be repeatedly performed, and preferably, the halogenated thin film forming step and the etching step may be set as one cycle and the cycle may be repeatedly performed a plurality of times, more preferably, 300 times to 600 times.

DETAILED DESCRIPTION

Various embodiments are directed to an atomic layer etching method using a ligand that does not have a metal precursor, so that the manufacturing cost of precursor material can be reduced by performing a ligand exchange reaction that excludes metal and etches a fluoride thin film in atomic units, without damaging a substrate by suppressing metal atoms from remaining on the substrate after etching.

According to an atomic layer etching method using a ligand exchange reaction in accordance with embodiments of the present disclosure, the manufacturing cost of a precursor material can be reduced by performing a ligand exchange reaction using a ligand including no metal or metal precursor, and a fluoride thin film can be etched in atomic units without damaging a substrate by suppressing metal atoms from remaining on the substrate after etching.

Hereinafter, before the present disclosure is described in detail through preferred embodiments, terms or words used in this specification and claims should not be interpreted as being limited to typical or dictionary meanings, but should be interpreted as meanings and concepts consistent with the technical spirit of the present disclosure.

Throughout the specification, when a certain part is referred to as "including" a certain component, it indicates that the part might not exclude, but further include other components, unless referred to the contrary.

Throughout the specification, the "%" symbol is used to indicate the concentration of a specific material, such as (weight/weight) % in the case of solid/solid, (weight/volume) % in the case of solid/liquid, and (volume/volume) % in the case of liquid/liquid, unless otherwise specified.

In each step, an identification numeral is used for convenience of description, and the identification numeral does not describe the order of each step, and each step may be performed differently from the specified order unless the specific order is clearly stated in the context. That is, each step may be performed in the same order as specified, may be performed substantially simultaneously, or may be performed in the reverse order.

Embodiments of the present disclosure relate to an atomic layer etching method using a ligand exchange reaction, in which the manufacturing cost of a precursor material can be reduced by performing a ligand exchange reaction excluding metal during the ligand exchange reaction by using a ligand without a metal or metal precursor. The ligand is used for atomic layer etching and a halogenated thin film can be etched in atomic units without damaging a substrate by suppressing metal atoms from remaining on the substrate after etching.

Figure 1:
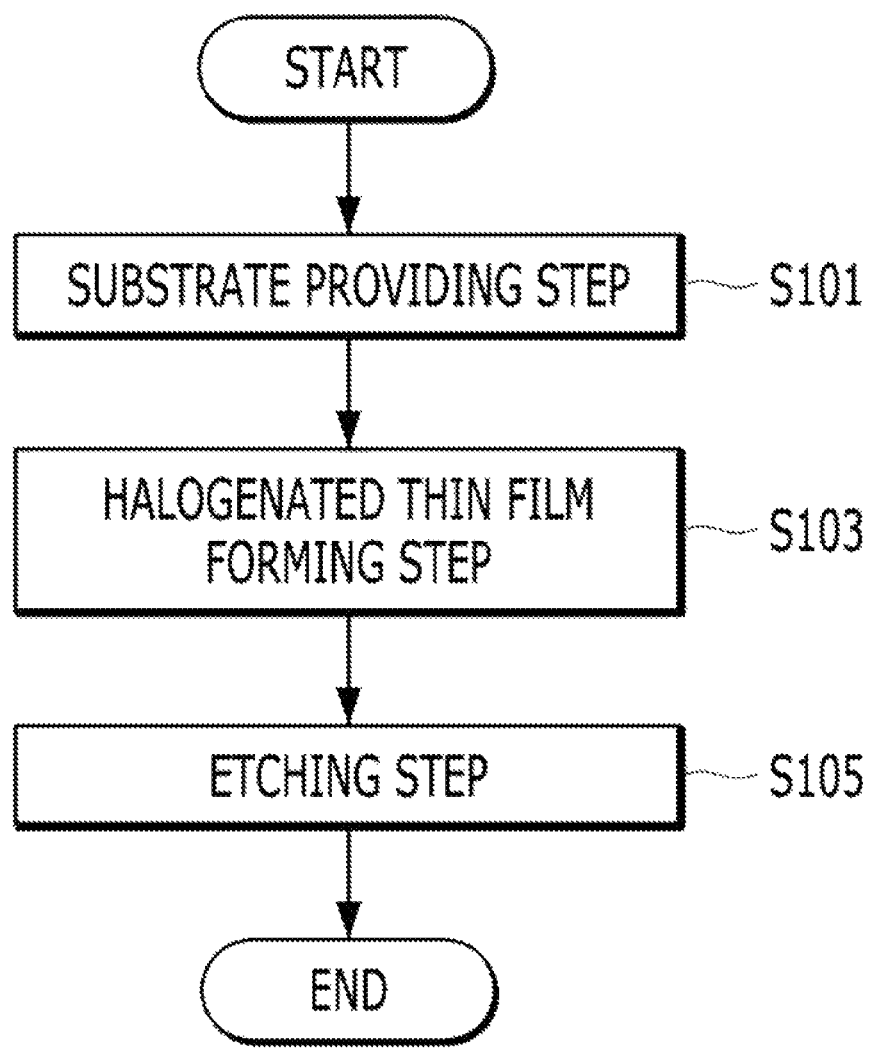
FIG. 1 is a flowchart illustrating an atomic layer etching method using a ligand exchange reaction in accordance with an embodiment of the present disclosure.

FIG. 1 is a flowchart schematically illustrating an atomic layer etching process using a ligand exchange reaction in accordance with an embodiment of an embodiment of the present disclosure.

As can be seen from FIG. 1, an atomic layer etching method using a ligand exchange reaction in accordance with an embodiment of the present disclosure includes: a substrate providing step S101 of putting a substrate with a thin film formed thereon into a reaction chamber; a halogenated thin film forming step S103 of forming a halogenated thin film on a surface of the thin film by infusing a halogenated gas into the reaction chamber with the substrate provided in step S101; and an etching step S105 of etching the halogenated thin film by infusing a ligand, which does not include a metal or a metal precursor, into the reaction chamber in which the substrate with the halogenated thin film formed through the halogenated thin film forming step S103 is located.

The substrate providing step S101 is a step of putting the substrate with the thin film formed thereon into the reaction chamber.

The substrate used in embodiments of the present disclosure may be any substrate as long as it is a member to be subjected to an etching process during a manufacturing process. Examples of substrates that may be used include various substrates for manufacturing a semiconductor device such as DRAM, NAND flash memory, CPU, and mobile CPU, and a display panel such as an LCD panel and an OLED panel.

The thin film formed on the substrate is a metal oxide thin film, and specifically, a thin film that may include a single oxide or two or more oxides, which are oxides of Group 4 metals in the periodic table of elements. For example, the thin film may be a metal oxide thin film of hafnium oxide ($HfO_2$), zirconium oxide ($ZrO_2$), zirconium silicon oxide ($ZrSiO_4$), and hafnium zirconium oxide ($HfZrO_4$), but embodiments are not particularly limited to the types listed here.

In this step, it is preferable that a laminar flow, which is a regular flow of fluid, is maintained inside the reaction chamber into which the substrate is put, and it is preferable that the substrate is introduced while the temperature of the reaction chamber is kept constant within the temperature range of 240° C. to 260° C., which is a temperature range in which modification and etching reactions may be performed in subsequent steps. In some embodiments, the substrate may be introduced to the reaction chamber initially at room temperature, and in yet other embodiments, the temperature of the reaction chamber may be increased to the above range.

The halogenated thin film forming step (S103) is a step of modifying the surface of the thin film into a material that can be removed in the etching step S105 to be described below, by infusing a halogenated gas, which is a modifying gas, into the reaction chamber into which the substrate is placed during the substrate providing step S101.

In the halogenated thin film forming step (S103), when the halogenated gas is infused into the reaction chamber into which the substrate is placed, the surface of the thin film is modified into the halogenated thin film. Such a halogenated thin film may include a Group 4 metal halide alone, or may include two or more Group 4 metal halides.

For example, when the thin film formed on the substrate is hafnium oxide or zirconium oxide, and a fluoride gas is used as the halogenated gas, the surface of the thin film is modified into hafnium fluoride ($HfF_4$) or zirconium fluoride ($ZrF_4$).

In this example, the halogenated gas that can be used is preferably one or more selected from the group consisting of hydrogen fluoride (HF), xenon fluoride ($XeF_2$), sulfur tetrafluoride ($SF_4$), sulfur hexafluoride ($SF_6$), hydrogen bromide, diatomic bromine, hydrogen chloride, and dichlorine, and more preferably, a fluoride gas containing a fluorine atom.

Such a halogenated gas may be supplied through a canister, and it is preferable to infuse the halogenated gas while the temperature is maintained at 34° C. to 36° C. by using a heating jacket. Since hydrogen fluoride, from among halogenated gases, has very high vapor pressure, it is more preferable to use an orifice gasket, and in an example the diameter of the orifice gasket may be about 0.1 mm to 1 mm.

The halogenated thin film formation reaction in the halogenated thin film forming step S103 is performed through a self-limiting reaction that occurs in atomic scale. That is, the reaction occurs only between the halogenated gas and the surface of the thin film, and no other additional reactions occur. Therefore, when a fluoride thin film is formed through the modification reaction on the surface of the thin film, no further reaction occurs even though an excess of unreacted reactive gas, that is, a halogenated gas, is supplied.

As described above, since the halogenated thin film formation reaction is performed in the above-described manner, the infusion amount and infusion pressure of the halogenated gas are not particularly limited or restricted. For example, based on a process pressure of 1.5 Torr, the halogenated gas may be infused at a pressure of 1 mTorr to 3 mTorr.

Figure 2:
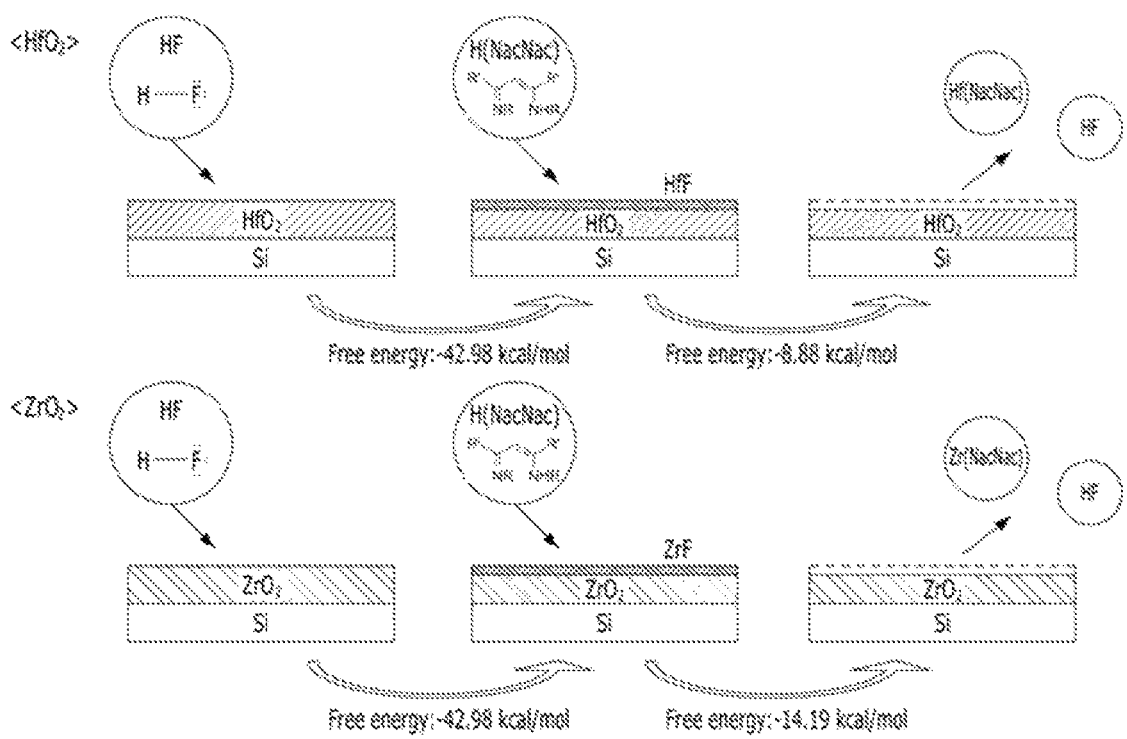
FIG. 2 is a schematic diagram illustrating the atomic layer etching method using a ligand exchange reaction in accordance with an embodiment of the present disclosure.

FIG. 2 is a schematic diagram illustrating the atomic layer etching method using a ligand exchange reaction in accordance with an embodiment of the present disclosure. In FIG. 2, an atomic layer etching reaction in which hafnium oxide and zirconium oxide thin films are applied is schematically illustrated, and the calculated Gibbs' free energy for each reaction is displayed.

In FIG. 2, hafnium halide or zirconium halide is formed on the surface of the thin film by infusing a halogenated gas (specifically, HF) into the substrate on which the oxide thin film is formed. It can be seen that the Gibbs' free energy in such a modification reaction is a negative number, and the modification reaction is a thermodynamically forward reaction.

Referring to FIG. 1, the etching step S105 is a step of etching the halogenated thin film by infusing a ligand, without a metal or metal precursor, into the reaction chamber in which the substrate including the halogenated thin film formed through the halogenated thin film forming step S103 is located. Through such a process, a ligand exchange reaction occurs between the halogenated thin film and the ligand to form a gaseous or volatile by-product containing atoms constituting the halogenated thin film, so that the halogenated thin film is etched.

In embodiments of the present disclosure, for the ligand exchange reaction in the etching step (S105), a ligand without a metal or metal precursor is used. This is because when a ligand including a metal or a metal precursor is used, reaction rate and selectivity are limited and metal atoms included in the ligand remain on the etched surface of a thin film and serve as impurities after the completion of the reaction. Accordingly, a ligand without a metal or metal precursor improves quality by controlling the thickness of the thin film, controlling the uniformity of the surface of the thin film, and preventing the occurrence of metal impurities.

An imine compound having two ketimine groups may be used as a ligand without a metal precursor in embodiments of the present disclosure. A ketimine group may be a primary ketimine group or a secondary ketimine group, and the two ketimine groups included in the imine compound may be the same as or different from each other. In this disclosure, as an example of an imine compound having the two ketimine groups, the compound may include 1,3-diketimines.

An imine compound having two ketimine groups may be a compound represented by the following chemical formula 1.

$$R_1\text{—}C\text{—}R_2 \quad \text{(chemical formula 1)}$$

In chemical formula 1 above, R1 and R2 are each independently —C(=NR)R*. Here, R and R* may be each independently a substituted or unsubstituted alkyl group, a substituted or unsubstituted alkenyl group, a substituted or unsubstituted alkynyl group, a substituted or unsubstituted alicyclic group, a substituted or unsubstituted phenyl group, or a substituted or unsubstituted benzyl group.

When substituted, R and R* may each be substituted with at least one functional group of a hydroxyl group, a carbonyl group, an aldehyde group, a haloformyl group, a carboxyl group, a carbonate group, an alkoxy group, an ether group, an acetal group, an amine group, an imide group, an azo group, a nitrile group, a nitro group, a sulfide group, a sulfonyl group, a sulfinyl group, and a halo group, however, the type of the functional group to be substituted is not limited to the above examples.

Preferably, an imine compound having two ketimine groups may be used as the ligand without a metal precursor. For example, in performing etching, when a fluoride gas is used as a modifying gas in the halogenated thin film forming step S103, a hafnium fluoride thin film is converted into {Hf(NacNac)}, and hydrogen fluoride or a zirconium fluoride thin film is converted into {Zr(NacNac)} and hydrogen fluoride through the ligand exchange reaction in the etching step S105. Such a ligand exchange reaction may be modeled in the following reaction formula 1.

$$MF_4 + H(NacNac) \rightarrow M(NacNac) + HF_4\uparrow \quad \text{(reaction formula 1)}$$

In reaction formula 1 above, M is hafnium or zirconium and H(NacNac) means acetylacetone of which the double bond oxygen is substituted with nitrogen.

When the ligand without a metal precursor is infused into the reaction chamber through the canister, it is preferably infused in the state of maintaining a temperature of 34° C. to 36° C. through the heating jacket. Particularly, when using 1,3-diketimines as the ligand without a metal or metal precursor, it is preferable to infuse the ligand into the reaction chamber by applying an orifice gasket having a diameter of about 0.1 mm to 5 mm due to high vapor pressure.

As can be seen from FIG. 2, when the ligand exchange reaction is performed by infusing the ligand without a metal or metal precursor into the substrate with the hafnium fluoride or the zirconium fluoride formed on the surface of the thin film, the reaction of reaction formula 1 above is performed. In such a case, since the Gibbs' free energy is a negative number, it can be seen that such an etching reaction is a thermodynamically spontaneous forward reaction.

Through the above-described etching step, etching is performed in units of single layers, for example, atomic layers. In order to etch the thin film to a desired thickness, the etching step S105 is set as one cycle, which is repeated a plurality of times, or both the halogenated thin film forming step S103 and the etching step S105 are set as one cycle, which are repeated a plurality of times, so that the thin film may be etched to a desired thickness.

In general, in an atomic layer deposition or atomic layer etching process, the deposition or etching effect is not significantly improved during a predetermined number of cycles because of the required incubation time.

In embodiments of the present disclosure, as described with reference to FIG. 3 below, the etching effect is rapidly improved after the incubation time is the same as about 300 cycle times, so the cycle is preferably repeated 300 times or more, preferably 300 times to 600 times, and more preferably 400 times to 500 times.

A purging step may be performed to remove unreacted excess reaction gas during the cycle or gaseous and/or volatile by-products generated after the completion of the reaction. For example, the purging may be performed by infusing an inert gas, for example, a gas such as $N_2$, Ar, or He, into the reaction chamber. As another example of purging, gas components in the reaction chamber may be removed by maintaining the inside of the reaction chamber in a vacuum state lower than atmospheric pressure. As another example, the purging may be performed by transferring a substrate to another reaction chamber.

Hereinafter, an atomic layer etching method using a ligand exchange reaction in accordance with embodiments of the present disclosure and physical properties of the thin film etched by the etching method will be described with reference to examples.

MANUFACTURING EXAMPLES

Example 1

A silicon substrate with a hafnium oxide thin film formed thereon was put into a chamber heated to a temperature of 250° C. under laminar flow of fluid, and hydrogen fluoride (HF) with the partial pressure of 2 mTorr based on the total pressure of 1.5 Torr at 35° C. was infused to form a hafnium fluoride thin film on the upper surface of the hafnium oxide thin film. Subsequently, a process of converting the hafnium fluoride thin film into {Hf(NacNac)} and hydrogen fluoride was repeated 500 times by infusing 1,3-diketimines at 35° C. into the reaction chamber, thereby etching the fluoride thin film.

Example 2

A fluoride thin film was etched by performing the same procedure as in Example 1, except that a zirconium oxide thin film was used instead of the hafnium oxide thin film.

Experimental Example

Figure 3:
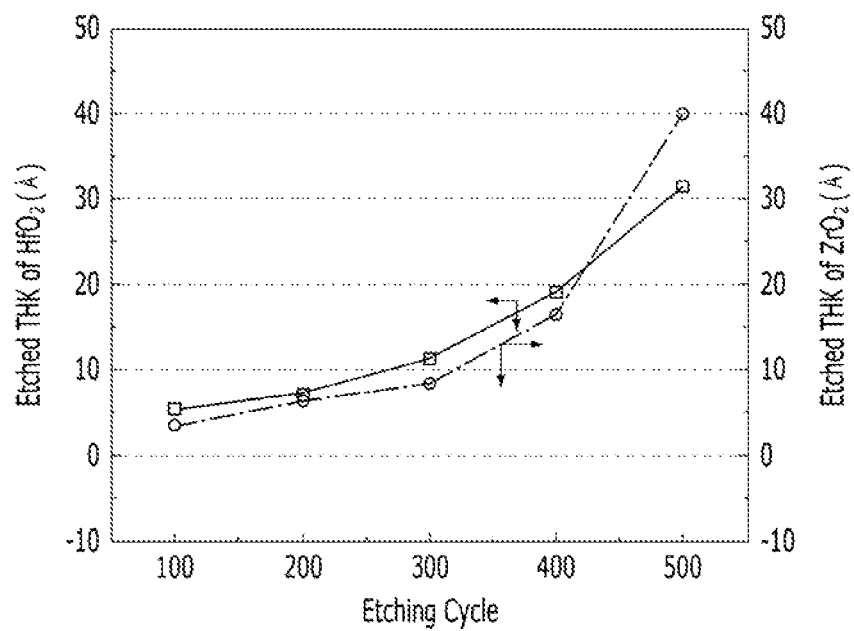
FIG. 3 is a graph illustrating results of measuring an etched thickness of a fluoride thin film of each of Examples 1 and 2.

The etched thicknesses of the fluoride thin films etched in Examples 1($HfO_2$) and 2($ZrO_2$) were measured for each cycle, and are illustrated in FIG. 3.

FIG. 3 is a graph illustrating results of measuring an etched thickness of a fluoride thin film of each of Examples 1 and 2. As illustrated in FIG. 3, the etched thickness is not increased significantly until the etching cycle is repeated 300 times. Furthermore, the etched thickness increases rapidly after the etching cycle is repeated 400 times. Therefore, it is preferable that the etching is performed 300 times or more, more preferably 400 times to 500 times.

That is, according to the atomic layer etching method using a ligand exchange reaction in accordance with embodiments of the present disclosure, a fluoride thin film can be etched in atomic units by using a ligand exchange reaction without damaging a substrate.

The present disclosure is not limited to the specific examples and descriptions described above, and any person skilled in the art to which the disclosure pertains can implement various modifications without departing from the subject matter of the present disclosure claimed in the claims, and such modifications fall within the protection scope of the present disclosure.

What is claimed is:

1. An atomic layer etching method using a ligand exchange reaction, the atomic layer etching method comprising:
   a substrate providing step of putting a substrate with a thin film formed thereon into a reaction chamber;
   a halogenated thin film forming step of forming a halogenated thin film on a surface of the thin film by infusing a halogenated gas into the reaction chamber; and
   an etching step of etching the halogenated thin film by infusing a ligand without a metal or metal precursor into the reaction chamber with the substrate with the halogenated thin film,
   wherein the ligand without a metal or metal precursor includes 1,3-diketimines, and
   wherein the halogenated thin film forming step and the etching step are combined as a single cycle that is repeatedly performed 400 times to 500 times.

2. The atomic layer etching method of claim 1, wherein the halogenated gas is at least one selected from the group consisting of hydrogen fluoride, xenon fluoride, sulfur tetrafluoride, sulfur hexafluoride, hydrogen bromide, diatomic bromine, hydrogen chloride, and dichlorine.

3. The atomic layer etching method of claim 1, wherein the thin film includes a single Group 4 metal oxide or two or more Group 4 metal oxides.

4. The atomic layer etching method of claim 3, wherein the Group 4 metal oxide includes one or more of hafnium oxide ($HfO_2$), zirconium oxide ($ZrO_2$), zirconium silicon oxide ($ZrSiO_4$), or hafnium zirconium oxide ($HfZrO_4$).

5. The atomic layer etching method of claim 1, wherein the halogenated thin film includes a group 4 metal halide alone, or includes two or more group 4 metal halides.

6. The atomic layer etching method of claim 1, wherein the etching step is repeatedly performed.

7. The atomic layer etching method of claim 1, wherein the halogenated gas in the halogenated thin film forming step includes a fluoride gas.

* * * * *